(12) United States Patent
Kikuchi et al.

(10) Patent No.: US 7,222,993 B2
(45) Date of Patent: May 29, 2007

(54) LIGHT EMITTING DIODE DEVICE

(75) Inventors: Satoru Kikuchi, Yamanashi-ken (JP); Koichi Fukasawa, Yamanashi-ken (JP)

(73) Assignee: Citizen Electronics Co., Ltd., Yamanashi-ken (JP)

( * ) Notice: Subject to any disclaimer, the term of this patent is extended or adjusted under 35 U.S.C. 154(b) by 32 days.

(21) Appl. No.: 10/812,920

(22) Filed: Mar. 31, 2004

(65) Prior Publication Data

US 2005/0002194 A1    Jan. 6, 2005

(30) Foreign Application Priority Data

Mar. 31, 2003    (JP)    ............... 2003-096915

(51) Int. Cl.
*F21V 7/00* (2006.01)

(52) U.S. Cl. ............ 362/300; 362/294; 362/298; 313/512

(58) Field of Classification Search ............ 362/612, 362/300, 618, 619, 298, 294, 346; 313/512; 257/98
See application file for complete search history.

(56) References Cited

U.S. PATENT DOCUMENTS

| | | | | |
|---|---|---|---|---|
| 5,249,104 A | * | 9/1993 | Mizobe | ............ 362/605 |
| 6,036,328 A | * | 3/2000 | Ohtsuki et al. | ............ 362/612 |
| 2004/0252509 A1 | * | 12/2004 | Lin | ............ 362/293 |
| 2006/0119250 A1 | * | 6/2006 | Suehiro et al. | ............ 313/498 |

FOREIGN PATENT DOCUMENTS

| | | |
|---|---|---|
| CN | 1 355571 | 6/2002 |
| GB | 2064865 | 6/1981 |
| JP | 61 007672 | 1/1986 |
| JP | 09 622206 | 3/1997 |
| JP | 2001 185762 | 7/2001 |
| JP | 2003 029654 | 1/2003 |

* cited by examiner

*Primary Examiner*—Sandra O'Shea
*Assistant Examiner*—Zahra I. Bennett
(74) *Attorney, Agent, or Firm*—Dennison, Schultz & MacDonald

(57) ABSTRACT

An LED is mounted on a circuit substrate, the LED is encapsulated by a transparent resin layer. A reflection layer is provided on the resin layer for reflecting and transmitting lights emitted from the LED.

4 Claims, 3 Drawing Sheets

LIGHT EMITTING DIODE DEVICE

BACKGROUND OF THE INVENTION

The present invention relates to a light emitting diode (LED) device used in an electronic equipment such as a personal computer, printer, PDA, facsimile machine, pager and a portable telephone.

In recent years, a liquid crystal display (LCD) having a back light is widely used as an illuminating panel device for illuminating various electronic equipments such as a notebook computer having an optical communication device, a PDA and a portable telephone. As an electronic equipment provided with such an LCD, an LCD back light for a portable telephone and an LED for illuminating various keys of a portable telephone are widely used.

FIG. 6 is a front view showing a conventional portable telephone disclosed in the Japanese Patent Application Laid Open 2002-24811. The portable telephone 10 has an LCD 11, three LED packages 12 for the LCD 11, a plurality of key switches 13, and a plurality of LED packages 14 for illuminating the key switches 13. The LED package has an LED chip mounted on a circuit substrate made of glass epoxy resin, the LED chip is encapsulated by a transparent or translucent resin. In the conventional device, a number of LED packages must be provided, since the conventional LED package is inferior in directivity. Therefore, there is a problem that the conventional device can not satisfy demand for low cost.

SUMMARY OF THE INVENTION

An object of the present invention is to provide an LED device which may illuminate a plurality of displays, and may be controlled in directivity and may be manufactured at a low cost.

According to the present invention, there is provided a light emitting diode device comprising a circuit substrate, an LED mounted on the circuit substrate, a transparent or translucent resin layer encapsulating the LED, a reflection layer provided on the resin layer for reflecting lights emitted from the LED.

The device further comprises a lower reflection film formed on the upper surface of the circuit substrate.

The reflection layer is provided for partly transmitting the lights emitted from the LED.

In an aspect of the invention, the reflection layer comprises a transparent holding plate and an upper reflection film provided between the upper surface of the resin layer and the underside of the holding plate.

The upper reflection film is formed by a metal plating.

These and other objects and features of the present invention will become more apparent from the following detailed description with reference to the accompanying drawings.

DETAILED DESCRIPTION OF THE PREFERRED EMBODIMENT

Figure 1:
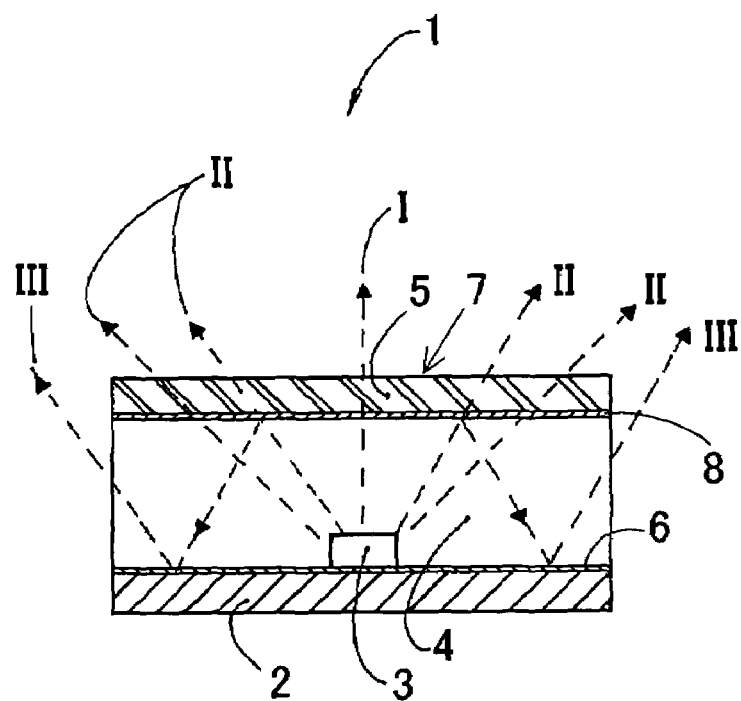
FIG. 1 is a sectional view showing a light emitting diode device according to a first embodiment of the present invention.

FIG. 1 is a sectional view showing a light emitting diode device according to a first embodiment of the present invention.

The LED device 1 comprises a circuit substrate 2 made of a resin such as a glass epoxy resin, a lower reflection film 6 formed on the surface of the circuit substrate 2 by Ag or Au plating, and an LED 3 mounted on the circuit substrate 2. The LED 3 is connected to electrodes provided on the surface of the substrate 2. The LED 3 is encapsulated by a transparent or translucent resin layer 4.

In accordance with the present invention, a reflection layer 5 is mounted on the resin layer 4. The reflection layer 5 comprises a holding plate 7 and an upper reflection film 8 formed on the underside of the holding plate 7. The holding plate 7 is made of a transparent or translucent resin. The upper reflection film 8 is formed by depositing or plating reflective metal which is able to reflect lights emitted from the LED 3. The upper reflection film 8 is formed into a thin film, for example 1 μm, so as to partly transmit lights from the LED 3.

Lights emitted from the LED 3 are transmitted through the resin layer 4 and the reflection layer 5 as central transmission light I and side transmission lights II. Parts of lights emitted from the LED are reflected by the upper reflection film 8 and further reflected by the lower reflection film 6 on the substrate 2 as re-reflection side lights III. The side lights III discharges also from the side wall of the resin layer 4. Thus, emitted lights are widely diffused.

If the thickness of the upper reflection film 8 is increased, reflectivity increases and transmittance reduces. Therefore, the light diffusion is increased. Thus, a desired expansion of diffusion can be obtained.

Figure 2:
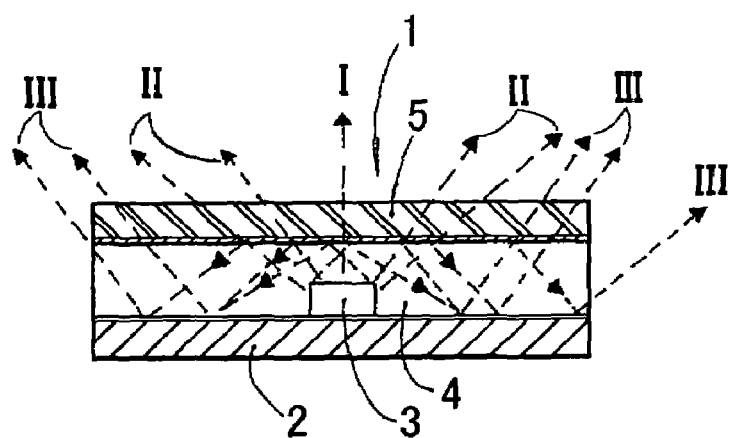
FIG. 2 is a sectional view showing a light emitting diode device according to a second embodiment of the present invention.

FIG. 2 is a sectional view showing a light emitting diode device according to a second embodiment of the present invention.

The LED device 1 is the same as the first embodiment in construction. Therefore the same parts as the first embodiment are identified by the same reference numerals as those of FIG. 1. The difference from the first embodiment is that the thickness of the resin layer 4 is thinner than that of the resin layer 4 in FIG. 1. By reducing the thickness of the resin layer 4, the angle of reflection of the re-reflected side light III increases, so that the diffusion expansion of the light III increases.

Thus, the diffusion expansion can also be set to a desired value by changing the thickness of the resin layer 4.

Figure 3:
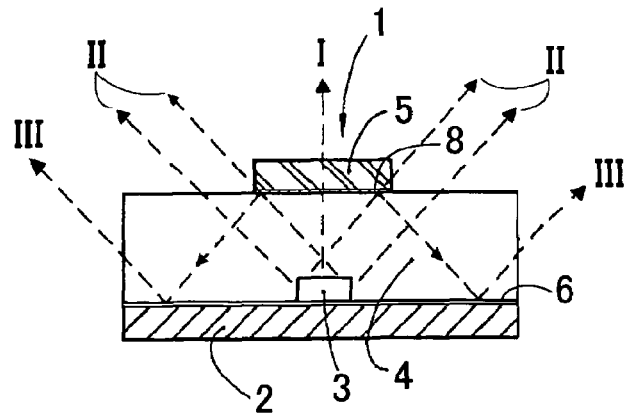
FIGS. 3 and 4 are sectional views showing a third embodiment.
Figure 4:
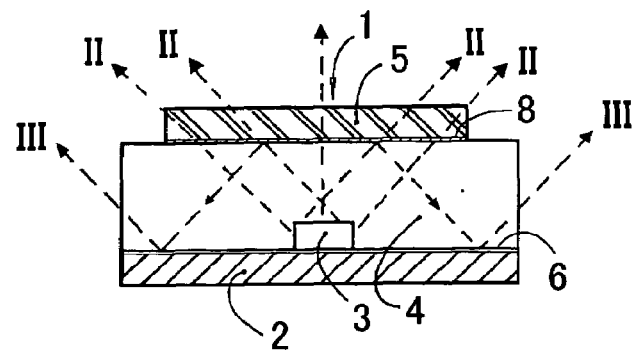

FIGS. 3 and 4 are sectional views showing a third embodiment. In the embodiment, the area of the reflection film 8 is changed. Although the reflectivity of the upper reflection film 8 is constant, the diffusion expansion and the brightness distribution are changed by varying the area of the upper reflection film 8.

If the area of the upper reflection film 8 is increased as shown in FIG. 4, the diffusion expansion of the re-reflection side lights III increases. Of course, if the reflectivity of the upper reflection film 8 is varied, the diffusion expansion and the brightness distribution are variously changed.

If the area of the upper reflection film 8 is reduced, the intensity of radiation of the transmission side light II increases.

Figure 5:
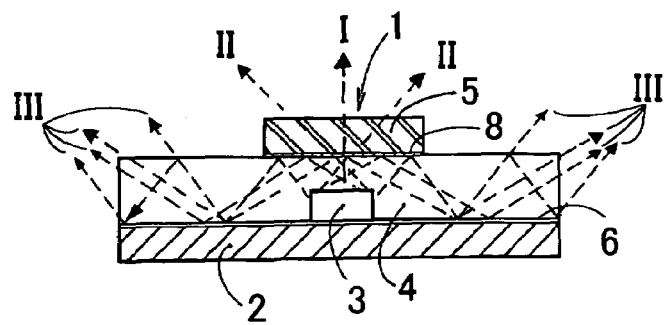
FIG. 5 is a sectional view showing a light emitting diode device according to a fourth embodiment of the present invention.
Figure 6:
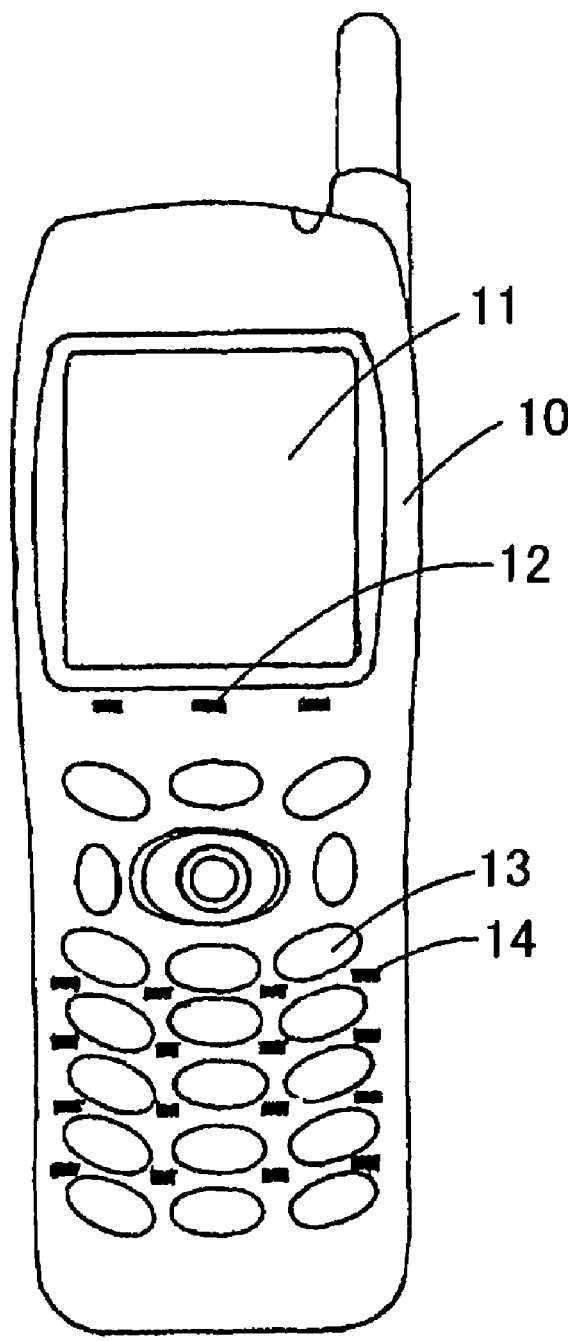
FIG. 6 is a front view showing a conventional portable telephone.

FIG. 5 is a sectional view showing a light emitting diode device according to a fourth embodiment of the present invention. In the LED device 1, the thickness of the resin layer 4 is reduced. Since the resin layer 4 is thin, the brightness of the re-reflection side lights III increases.

As described above, the distribution of lights is widely changed. If the area of the upper reflection film 8 is increased or the thickness of the resin layer 4 is reduced, the diffusion expansion of the re-reflection side light III increases. If the area of the upper reflection film 8 is reduced, the intensity of radiation of the transmission side light II increases.

Thus, in accordance with the present invention, desired expansion of emitted lights from the LED and desired distribution of brightness can be obtained.

While the invention has been described in conjunction with preferred specific embodiment thereof, it will be understood that this description is intended to illustrate and not limit the scope of the invention, which is defined by the following claims.

What is claimed is:

1. A light emitting diode device comprising:
    a circuit substrate;
    a lower reflection film provided on an upper surface of the circuit substrate;
    an LED mounted on the upper surface of the circuit substrate;
    a resin layer encapsulating the LED and the lower reflection film;
    an upper reflection layer provided on an upper surface of the resin layer,
    the upper reflection layer formed by a metal being disposed opposite the LED, and being formed into a thin film to transmit a portion of light rays emitted by the LED through the upper reflection layer in a forward direction and to reflect another portion of the light rays emitted by the LED,
    wherein the light rays reflected by the upper reflection layer are further reflected by the lower reflection film on the circuit substrate, and the light rays reflected by the lower reflection film are discharged in the forward direction passing through the upper reflection layer and through side walls of the resin layer to be diffused.

2. The device according to claim 1 wherein the upper reflection layer comprises a transparent holding plate and an upper reflection film provided between the upper surface of the resin layer and the underside of the holding plate.

3. The device according to claim 2 wherein the upper reflection film is formed by a metal plating.

4. The device according to claim 2 wherein the upper reflection film has an area smaller than an area of the resin layer.

* * * * *